United States Patent
Ren et al.

(10) Patent No.: US 7,789,989 B2
(45) Date of Patent: Sep. 7, 2010

(54) METHOD FOR MANUFACTURING RIGID-FLEXIBLE PRINTED CIRCUIT BOARD

(75) Inventors: Lin Ren, Shenzhen (CN); Ying Su, Shenzhen (CN); Cheng-Hsien Lin, Tayuan (CN)

(73) Assignees: FuKui Precision Component (Shenzhen) Co., Ltd., Shenzhen, Guangdong Province (CN); Foxconn Advanced Technology Inc., Tayuan, Taoyuan (TW)

( * ) Notice: Subject to any disclaimer, the term of this patent is extended or adjusted under 35 U.S.C. 154(b) by 0 days.

(21) Appl. No.: 12/270,612

(22) Filed: Nov. 13, 2008

(65) Prior Publication Data

US 2009/0183823 A1 Jul. 23, 2009

(30) Foreign Application Priority Data

Jan. 23, 2008 (CN) .......................... 200810300190

(51) Int. Cl.
*B29C 65/00* (2006.01)

(52) U.S. Cl. ....................... 156/256; 156/250; 156/257; 156/292

(58) Field of Classification Search ...................... None
See application file for complete search history.

(56) References Cited

U.S. PATENT DOCUMENTS

| 4,872,934 | A | * | 10/1989 | Kameda | ..................... 156/250 |
| 4,931,134 | A | * | 6/1990 | Hatkevitz et al. | ............. 216/17 |
| 5,378,306 | A | * | 1/1995 | Cibulsky et al. | ............. 216/20 |

* cited by examiner

*Primary Examiner*—Mark A Osele
*Assistant Examiner*—Nickolas Harm
(74) *Attorney, Agent, or Firm*—Andrew C. Cheng (57) ABSTRACT

A method for manufacturing a rigid-flexible printed circuit boards includes following steps. Firstly, a flexible substrate is provided. Secondly, at least one slit is defined in the flexible substrate. Thirdly, a rigid substrate having a structure corresponding to the flexible substrate is provided. Fourthly, the flexible substrate is laminated to the rigid substrate to obtain a laminated substrate. Fifthly, part of the rigid substrate is removed. Sixthly, the laminated substrate is cut along an imaginary boundary line to remove waste portion of the laminated substrate. Thus, a rigid-flexible printed circuit board is obtained.

8 Claims, 10 Drawing Sheets

METHOD FOR MANUFACTURING RIGID-FLEXIBLE PRINTED CIRCUIT BOARD

BACKGROUND

1. Technical Field

The present invention relates to printed circuit boards, particularly to a method for manufacturing a rigid-flexible printed circuit board.

2. Description of Related Art

Rigid-flexible printed circuit boards (R-F PCBs) are widely used in electronic devices. Rigid-flexible printed circuit board has a rigid region and a flexible region. The rigid region is configured for assembling electronic components and maintaining electrical connections among the electronic components. The flexible region is connected to the rigid region and can be bent relative to the rigid region. Thus, a number of electronic components can be assembled on the rigid region of the rigid flexible printed circuit board without occupying a large amount of space.

Figure 7:
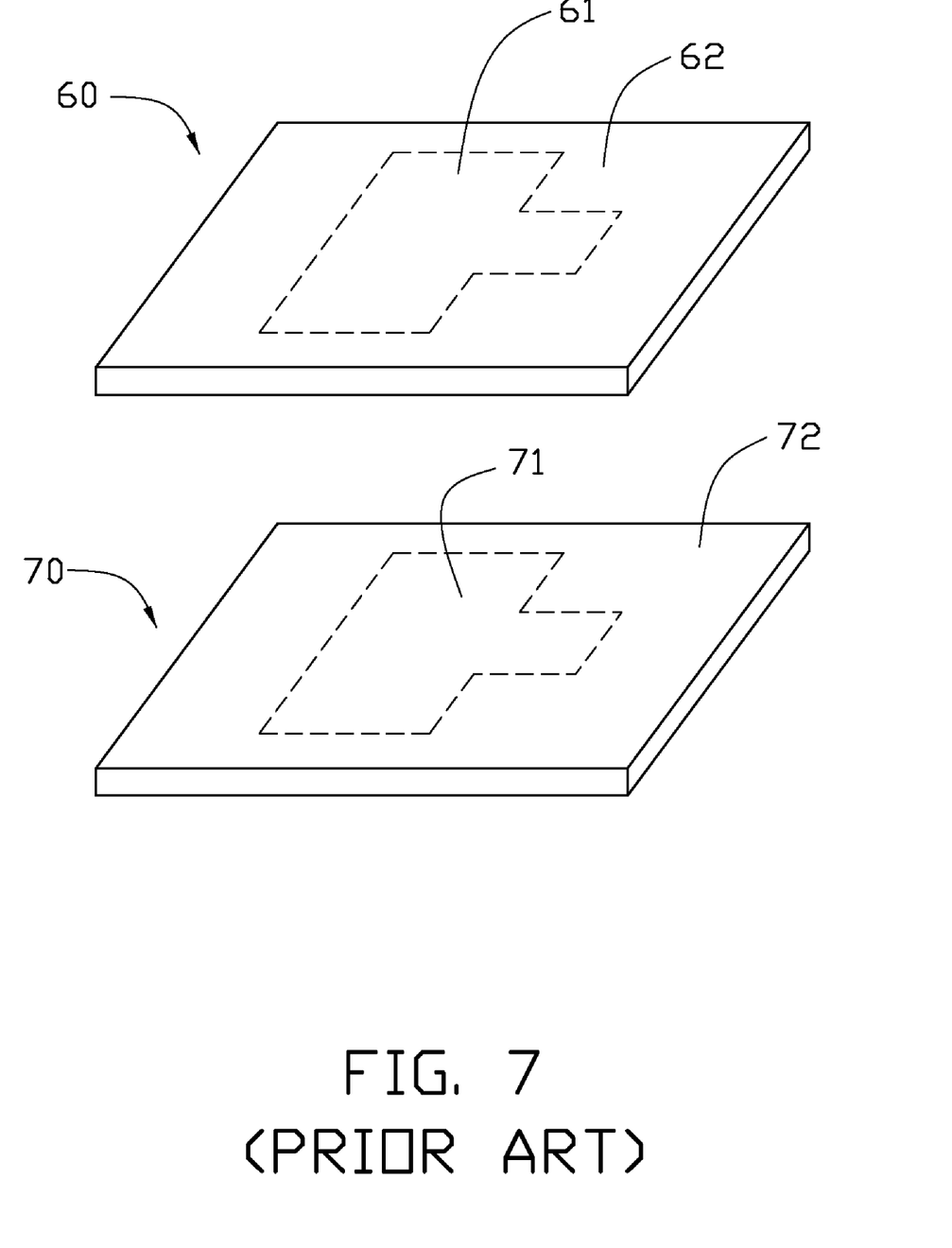
FIG. 7 is a schematic view of a typical flexible substrate and a rigid substrate.
Figure 8:
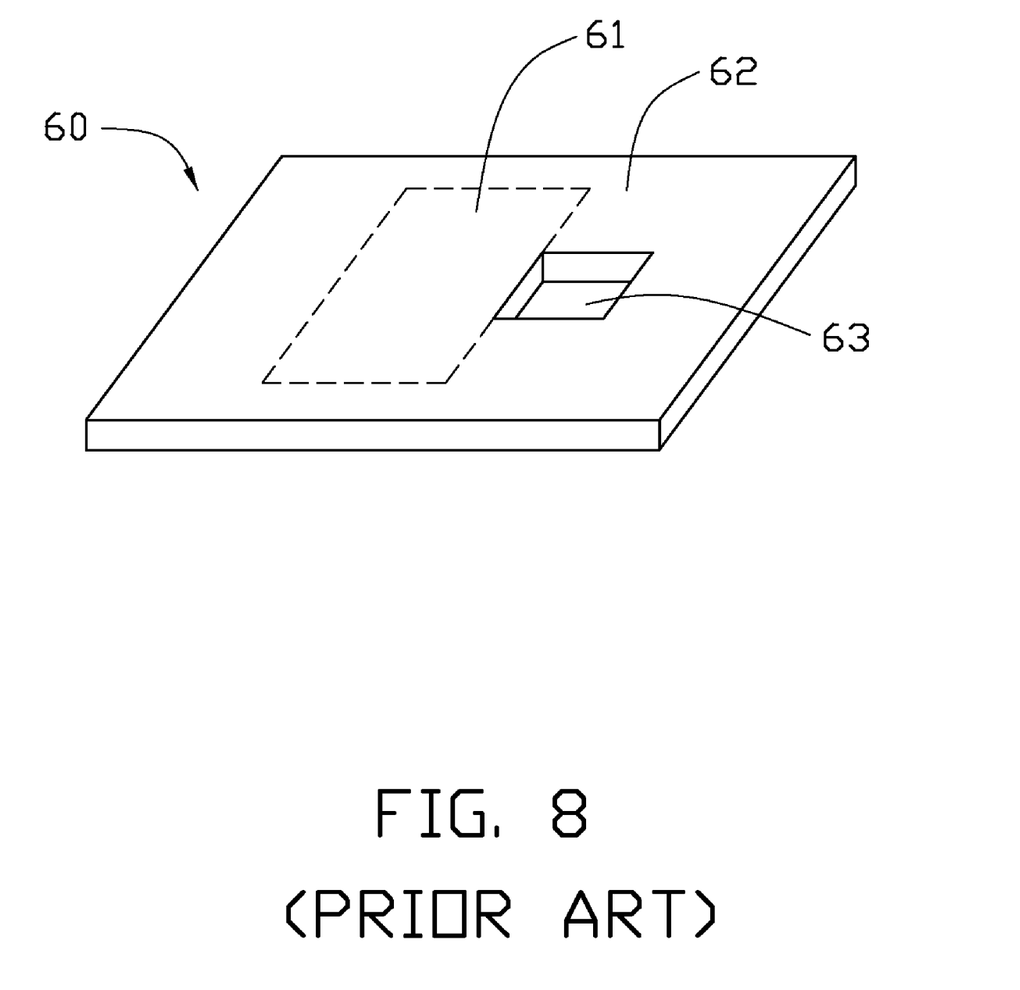
FIG. 8 is a schematic view of the rigid substrate of FIG. 7 with an opening is formed therein.
Figure 9:
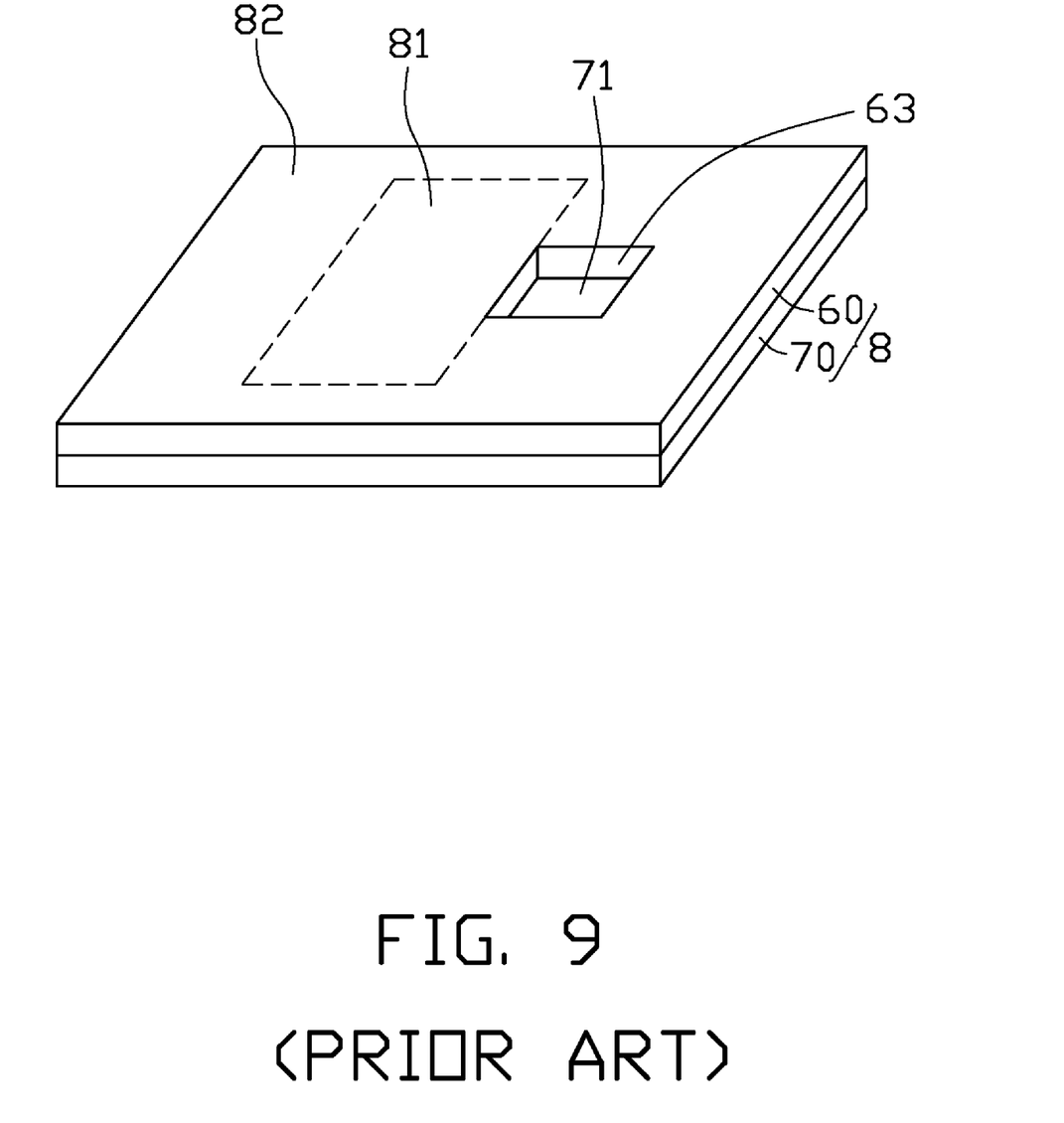
FIG. 9 is a schematic view of a laminated substrate, which is obtained by laminating the rigid substrate of FIG. 8 onto the flexible substrate of FIG. 7.
Figure 10:
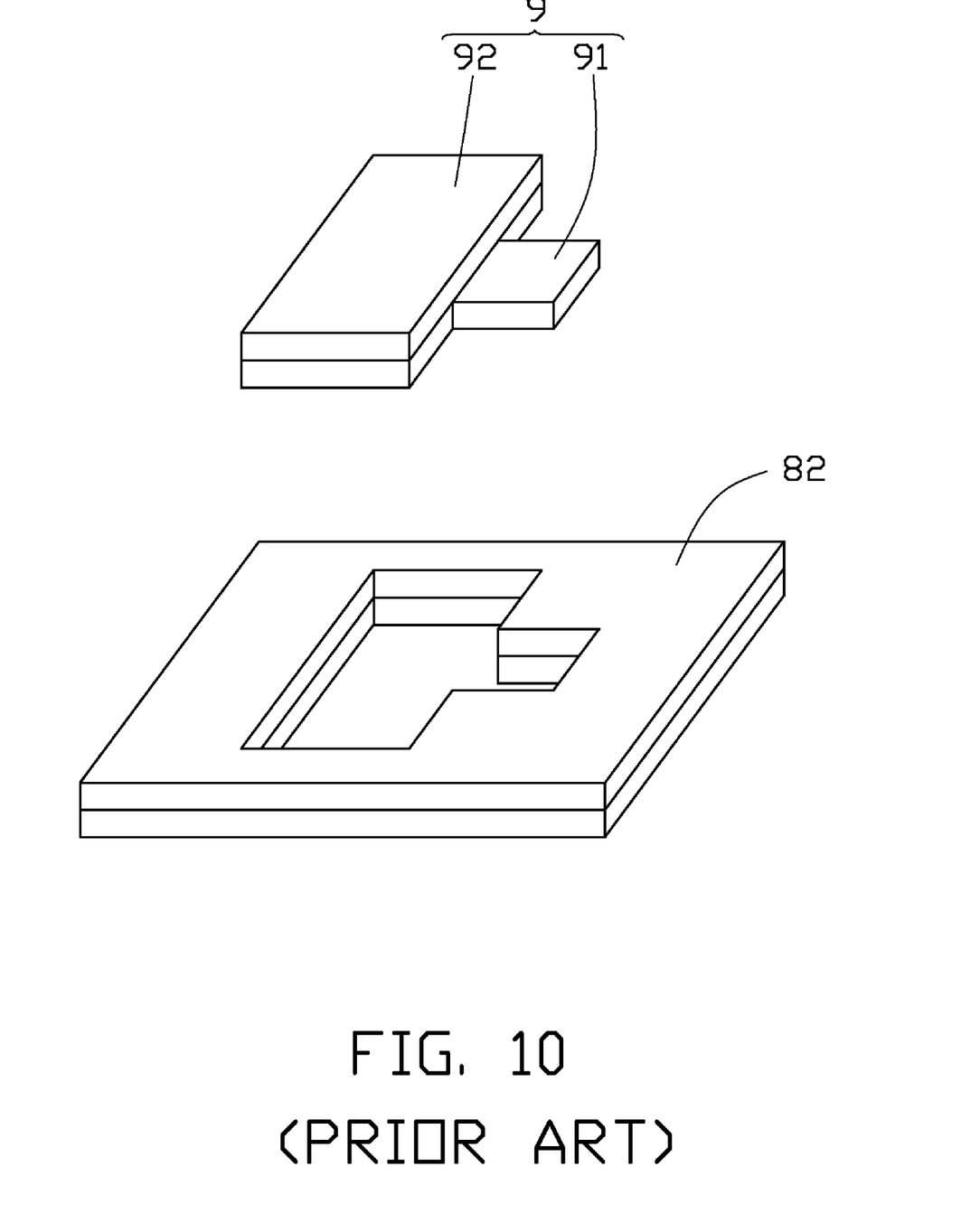
FIG. 10 is a schematic view of a rigid-flexible printed circuit board, which is obtained by removing the pre-cut region from the laminated substrate shown in FIG. 9.

A typical method for manufacturing a rigid-flexible printed circuit board is shown in FIGS. 7-10. As shown in FIG. 7, a rigid substrate 60 and a flexible substrate 70 are provided. The rigid substrate 60 has a first product region 61 and a first periphery region 62 around the first product region 61. The flexible region 70 has a second product region 71 corresponding to the first product region 61 and a second periphery region 72 corresponding to the first periphery region 62. As shown in FIG. 8, an opening 63 is formed in a predetermined position of the first product region 61 of the rigid substrate 60. As shown in FIG. 9, the rigid substrate 60 and the flexible substrate 70 are laminated to form a laminated substrate 8 having a predetermined region 81 and a pre-cut region 82. In detail, the first and second product region 61, 71 are laminated to form the predetermined region 81, the first and second periphery region 62, 72 are laminated to form the pre-cut region 82. In the predetermined region 81, a portion of the second product region 71 exposed from the opening 63 is adapted to form a flexible region, other portion of the second product region 71 laminated with the first product region 61 is adapted to form a rigid region. As shown in FIGS. 9-10, the laminated substrate 8 is cut along the boundary between the predetermined region 81 and the pre-cut region 82, thus the pre-cut region 82 of the laminated substrate 8 is removed and the predetermined region 81 forms a rigid-flexible printed circuit board 9 which has a flexible region 91 and a rigid region 92.

However, a material property of the rigid region 92 is different to that of the flexible region 91, when the pre-cut region 82 around the predetermined region 81 is removed simultaneously with a milling cutter, burrs may be formed on the margin of the flexible region 91. In addition, the thickness of the rigid region 92 is larger than that of the flexible region 91, thus, when the laminated substrate 8 is cut with the same cutting parameter, the cutting precision of the rigid region 92 and the flexible region 91 is different. Thus, the quality of the rigid-flexible printed circuit board 9 is affected.

What is needed, therefore, is a method for manufacturing the rigid-flexible printed circuit board which can overcome the above-described problems.

SUMMARY

An exemplary embodiment of a method for manufacturing a rigid-flexible printed circuit board includes following steps. Firstly, a flexible substrate is provided. The flexible substrate includes a main portion and a peripheral margin portion. The main portion includes a first laminating section and an exposed section. Secondly, at least one slit is defined in the flexible substrate along at least one first imaginary boundary line between the exposed section and the peripheral margin portion. Thirdly, a rigid substrate is provided. The rigid substrate includes a main portion and a peripheral margin portion. The main portion includes a second laminating section having a similar shape to the first laminating section and an unwanted section having a similar shape to the exposed section. Fourthly, the flexible substrate is laminated to the rigid substrate to obtain a laminated substrate in such a matter that the first and second laminating sections coincide with each other, and the exposed section coincide with the unwanted section. Fifthly, the unwanted section is removed. Sixthly, the laminated substrate is cut along an imaginary boundary line between the second laminating section and the peripheral margin portion to remove the peripheral margin portions of the flexible substrate and the rigid substrate.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

A method of manufacturing a rigid-flexible printed circuit board according to an embodiment will now be described in detail below with reference to the drawings.

The method includes the steps in no particular order of:

(1) providing a flexible substrate, the flexible substrate including a main portion and a peripheral margin portion, the main portion including a first laminating section and an exposed section;

(2) defining at least one slit in the flexible substrate along at least one first imaginary boundary line between the exposed section and the peripheral margin portion;

(3) providing a rigid substrate, the rigid substrate comprising a main portion and a peripheral margin portion, the main portion including a second laminating section having a similar shape to the first laminating section and an unwanted section having a similar shape to the exposed section;

(4) laminating the flexible substrate to the rigid substrate to obtain a laminated substrate in such a matter that the first and second laminating sections are coincide with each other, and the exposed section is coincide with the unwanted section;

(5) removing the unwanted section; and (6) cutting the laminated substrate along an imaginary boundary line between the second laminating section and the peripheral margin portion to remove the peripheral margin portions of the flexible substrate and the rigid substrate.

Figure 1:
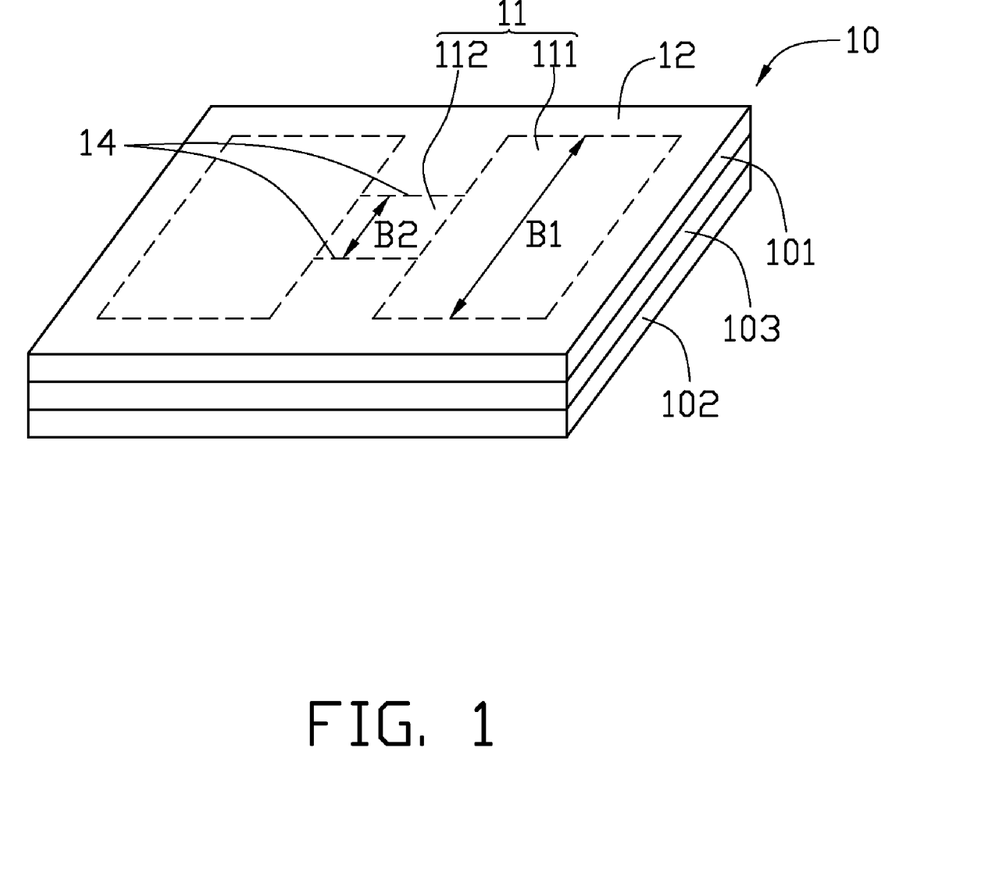
FIG. 1 is a schematic view of a flexible substrate, the flexible substrate including a main portion and a peripheral margin portion, the main portion including a first laminating section and an exposed section.

Referring to FIG. 1, in step (1), a flexible substrate 10 is provided.

The flexible substrate 10 is a double-sided flexible copper clad laminate (double-sided FCCL), and includes a first electrically conductive layer 101, a second electrically conductive layer 102, and an insulating layer 103 positioned between the first and second electrically conductive layers 101, 102. The flexible substrate 10 defines a main portion 11 and a peripheral margin portion 12. In the present embodiment, the main portion 11 includes two first laminating sections 111 and an exposed section 112 connected between the two first laminating sections 111. The first laminating sections 111 and the exposed section 112 are all rectangular shaped. In the illustrated embodiment, a width B2 of the exposed section 112 is less than a width B1 of each of the first laminating sections 111. The first laminating sections 111 and the exposed section 112 each have electrically conductive patterns (not shown) formed therein, which are formed in the first and second electrically conductive layers 101, 102. The first laminating sections 111 and the exposed section 112 cooperatively constitute a printed circuit board. The peripheral margin portion 12 around the main portion 11 is configured for supporting the main portion 11 and will be removed in a later step, so no electrically conductive pattern formed in the peripheral margin portion 12 is needed.

It is noted that the flexible substrate 10 also can be a single-sided board or a multilayer board. It is also noted that the number of the first laminating sections 111 of the flexible substrate 10 is not limit to be two, less or more may be defined therein according to practical need.

Figure 2:
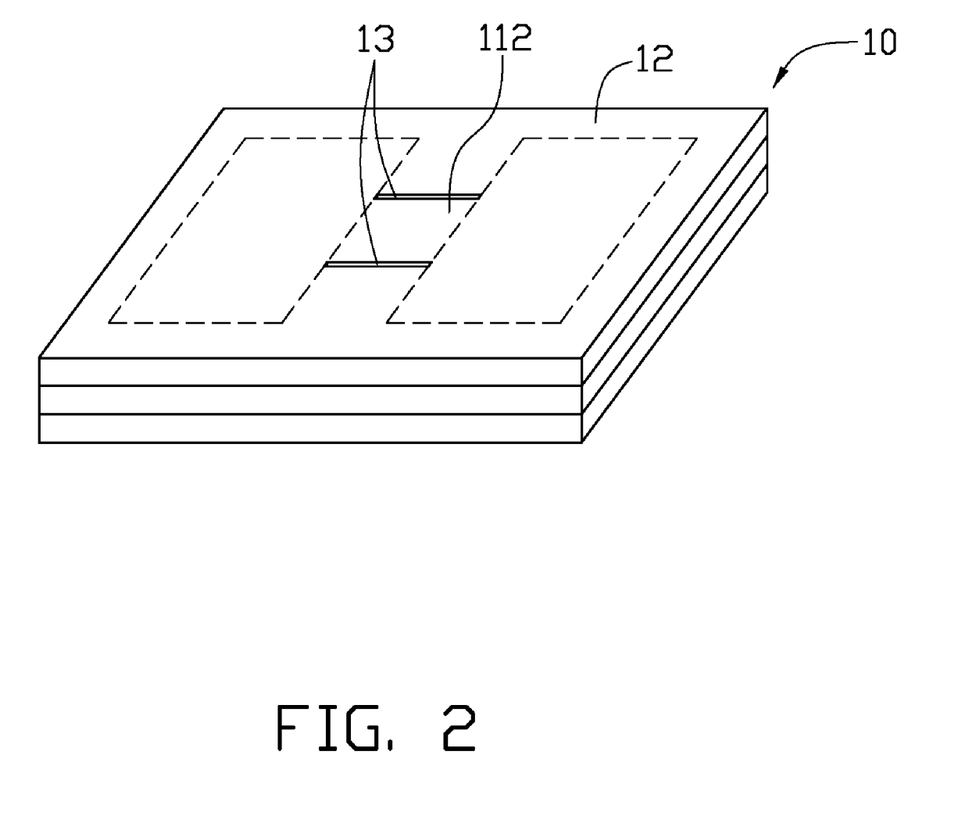
FIG. 2 is similar to FIG. 1, but showing two slits defined in the flexible substrate along two first imaginary boundary lines between the exposed section and the peripheral margin portion.

Referring to FIG. 1 and FIG. 2, in step (2), at least one slit 13 is defined in the flexible substrate 10 along at least one first imaginary boundary line 14 between the exposed section 112 and the peripheral margin portion 12.

In the present embodiment, the flexible substrate 10 has two parallel straight first imaginary boundary lines 14 between the exposed section 112 and the peripheral margin portion 12, thus, the flexible substrate 10 has two parallel straight slits 13 along the two first imaginary boundary lines 14. The slits 13 can be formed using a laser beam, a blanking die or other means having high cutting accuracy. Each of the slits 13 penetrates through the first electrically conductive layer 101, the second electrically conductive layer 102 and the first insulating layer 103.

Additionally, if the flexible substrate 10 has only one first laminating section 111 and one exposed section 112, the first imaginary boundary line 14 defined between the exposed section 122 and the peripheral margin portion 12 would be a continuous polygonal line, and the slit 13 formed in the flexible substrate 10 would be a continuous polygonal shaped groove.

Figure 3:
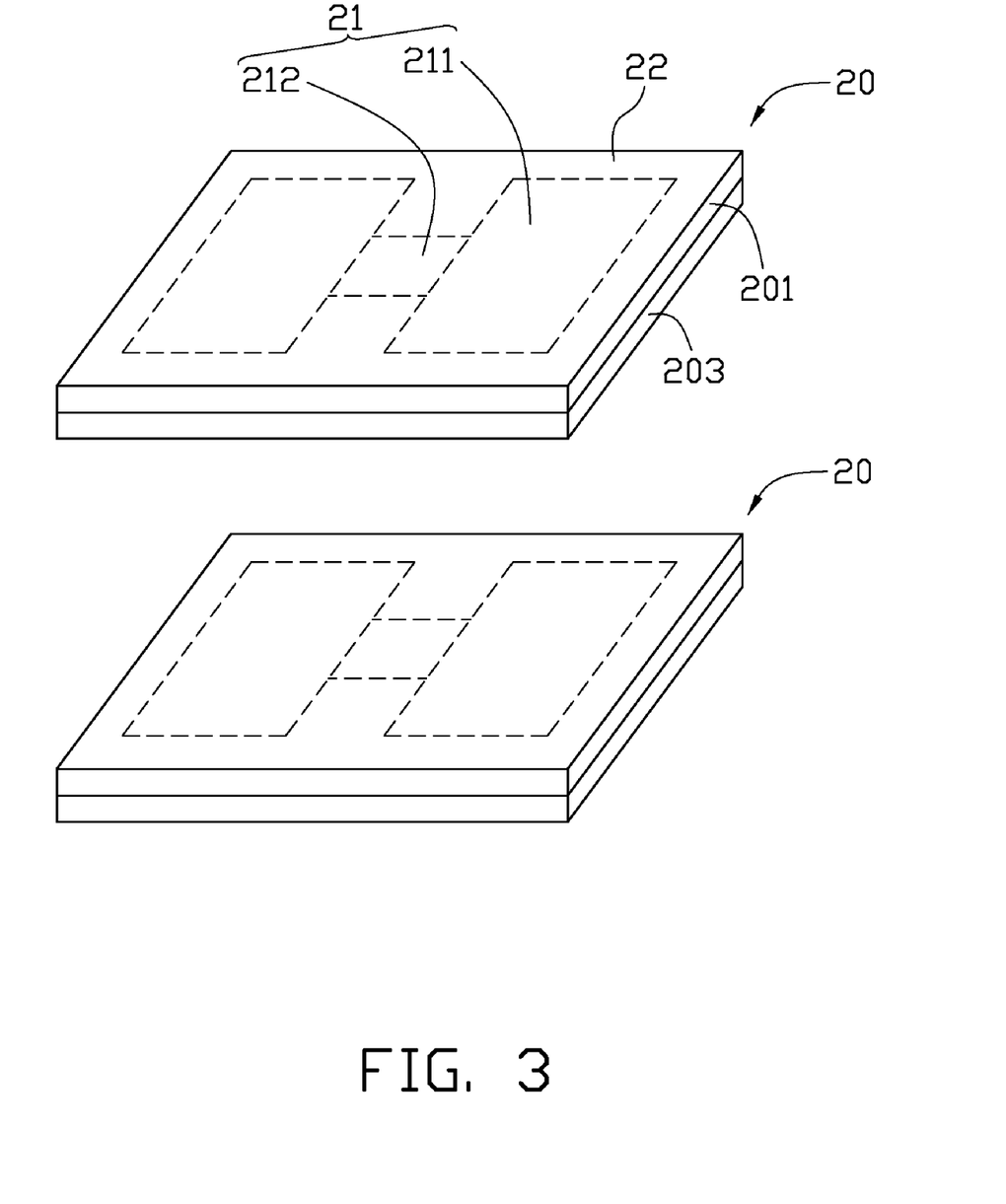
FIG. 3 is a schematic view of two rigid substrates each having a main portion and a peripheral margin portion, the main portion including a second laminating section having a similar shape to the first laminating section and an unwanted section having a similar shape to the exposed section.

Referring to FIG. 3, in step (3), two rigid substrates 20 each have a structure (e.g., appearance, electrically conductive patterns or other elements) corresponding to the flexible substrate 10.

In the present embodiment, each of the rigid substrates 20 is a single-sided copper clad laminate (single-sided CCL), and includes a third electrically conductive layer 201 and a second insulating layer 203. Correspondingly, the rigid substrates 20 each include a main portion 21 and a peripheral margin portion 22. The main portion 21 includes two second laminating sections 211 having a similar shape to the first laminating sections 111, and an unwanted section 212 having a similar shape to the exposed section 112. Electrically conductive patterns can be formed in each of the second laminating sections 211 using the third electrically conductive layer 201. No electrically conductive patterns formed in the unwanted section 212 and the peripheral margin portion 22 are needed.

It is noted that the number of the rigid substrate 20 is not limited to be two, less or more may be provided according to practical need.

Figure 4:
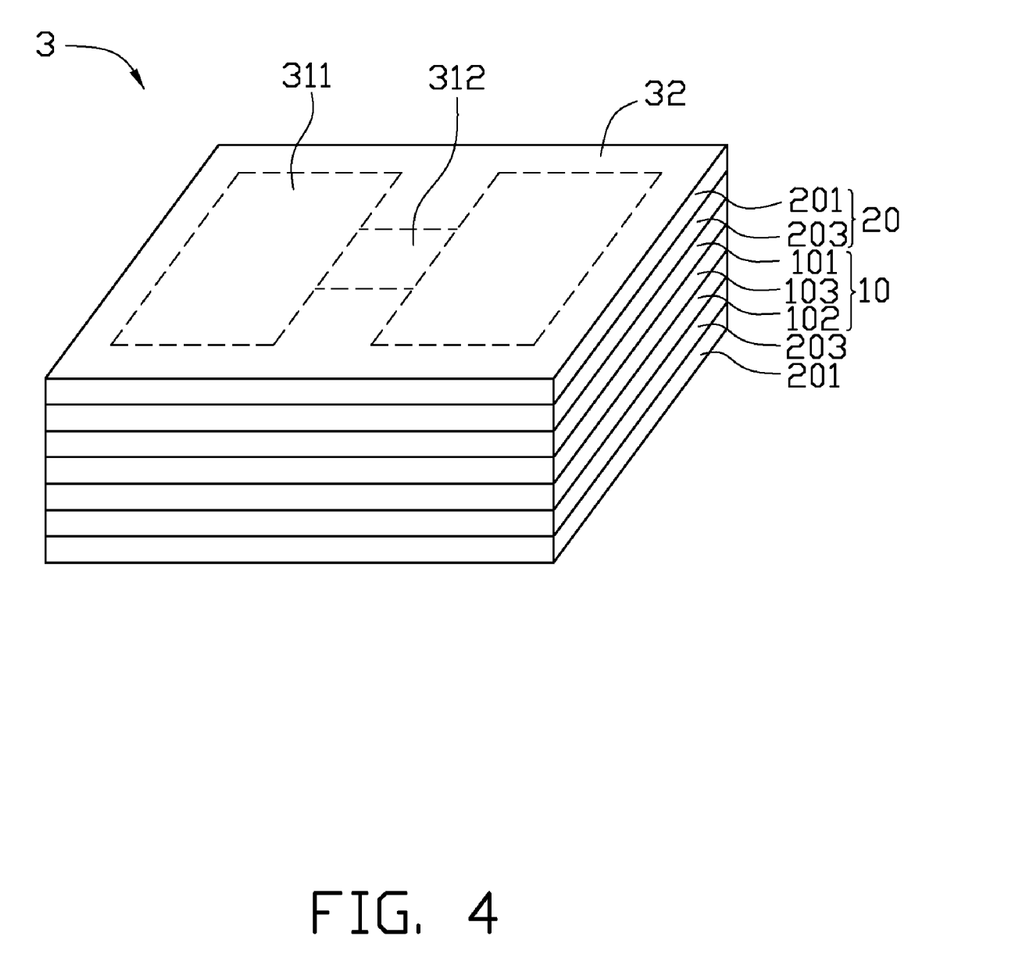
FIG. 4 is a schematic view of a laminated substrate, wherein the rigid substrates are laminated on opposite sides of the flexible substrate.

Referring to FIG. 4, in step (4), the flexible substrate 10 is aligned with and laminated onto/sandwiched therebetween the rigid substrates 20 to obtain a laminated substrate 3 in such a matter that the first laminating sections 111 coincide with and are combined with the corresponding second laminating sections 211 to form first sections 311, the exposed section 112 coincides with and is combined with the unwanted sections 212 to form a second section 312, and the peripheral margin portions 12, 22 coincide with and are combined with each other to form a third section 32.

In the present embodiment, the flexible substrate 10 is disposed and laminated between the two rigid substrates 20. The first electrically conductive layer 101 is in contact with the second insulating layer 203 of one rigid substrate 20, the second electrically conductive layer 102 is in contact with the second insulating layer 203 of another rigid substrate 20.

In order to ensure the laminated substrate 3 can be formed into a rigid-flexible printed circuit board, it is noted that if the laminated substrate 3 includes a number of flexible substrates 10 and a number of rigid flexible substrates 20, the rigid substrates 20 should be arranged at the outermost sides of the laminated substrate 3.

Figure 5:
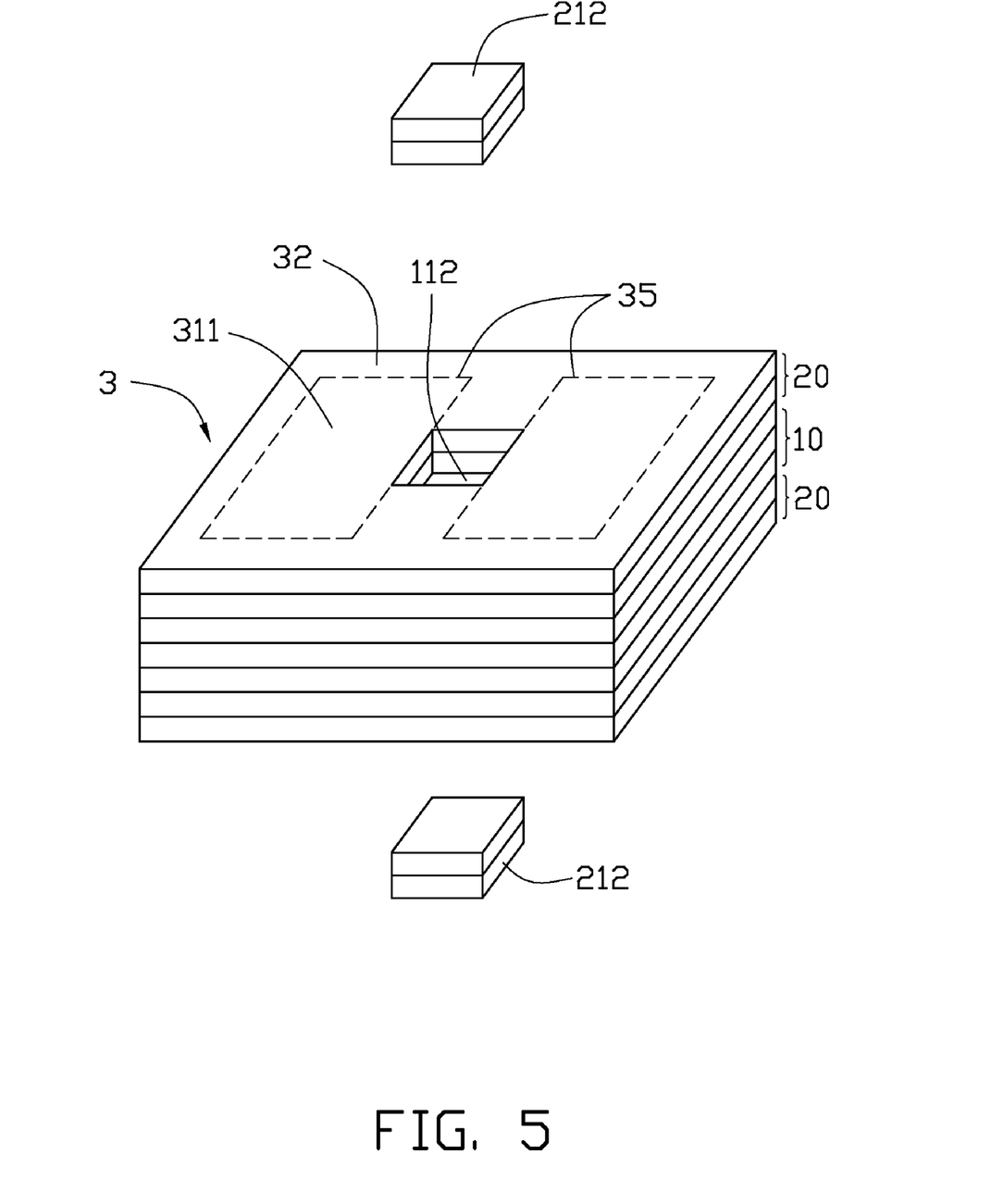
FIG. 5 is similar to FIG. 4, but showing unwanted sections are removed.

Referring to FIG. 5, in step (5), the unwanted sections 212 of the rigid substrates 20 are removed, and the exposed section 112 of the flexible substrate 10 is exposed. Thus, the exposed section 112 can be regarded as a flexible section of the laminated substrate 3.

Figure 6:
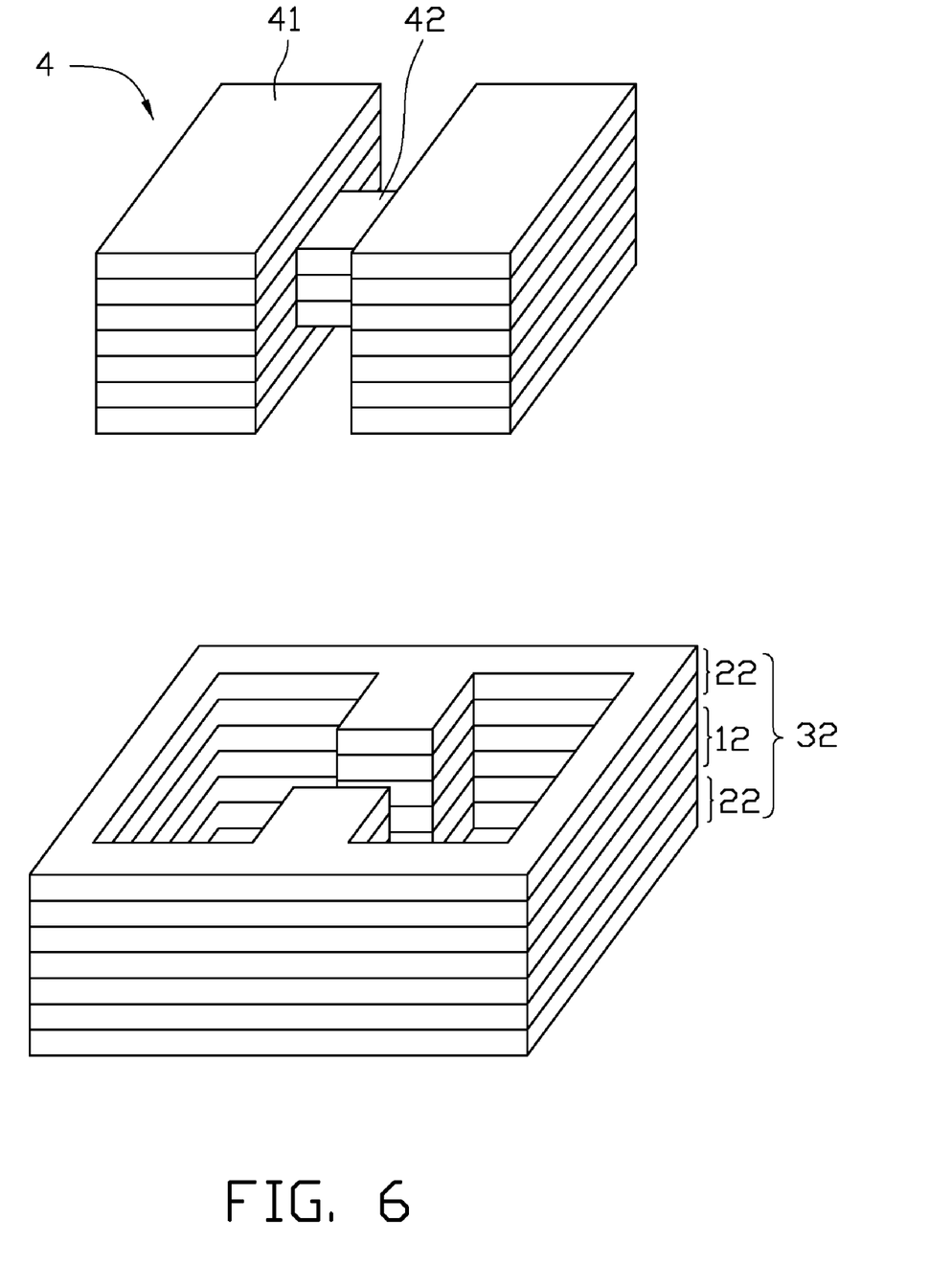
FIG. 6 is a schematic view of a rigid-flexible printed circuit board, which is obtained by cutting the laminated substrate along an imaginary boundary line between the second laminating section and the peripheral margin portion.

Referring to FIG. 5 to FIG. 6, in step (6), the laminated substrate 3 is cut along imaginary boundary lines 35 between the first sections 311 and the third section 32 to remove the third section 32, i.e., peripheral margin portions 12, 22 of the flexible substrate 10 and the rigid substrate 20. The imaginary boundary lines 35 between the first sections 311 and the third section 32 coincide with the borderlines between the second laminating sections 211 and the peripheral margin portion 22 of the rigid substrate 20, whilst coincide with the borderlines between the first laminating sections 111 and the peripheral margin portion 112 of the flexible substrate 10. In the present embodiment, the first sections 311 each have an imaginary boundary line 35 between the first section 311 and the third section 32 which is a continuous polygonal line.

After the third section 32 of the laminated substrate 3 is removed, a rigid-flexible printed circuit board 4 is obtained. The rigid-flexible printed circuit board 4 has two rigid regions 41 formed from the first sections 311 and one flexible region 42 formed from the exposed section 212.

Furthermore, a plurality of plated through holes (not shown) can be formed in the rigid-flexible printed circuit board 4 to electrically interconnect the first, second and third electrically conductive layers 101, 102 and 201. A coverlayer (not shown) can be formed on the rigid-flexible printed circuit board 4 to protect the conductive patterns formed by the third electrically conductive layers 201.

In the present embodiment, because slits 13 are formed in the flexible substrate 10 before laminating the flexible substrate 10 and the rigid substrates 20, no burrs are occurred in the flexible region 42. The appearance of the rigid-flexible printed circuit board 4 can be more precisely controlled than prior art manufacturing methods. Thus, the quality of the rigid-flexible printed circuit board 4 is improved.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A method for manufacturing a rigid-flexible printed circuit board, comprising:
   providing a flexible substrate, the flexible substrate including a main portion and a peripheral margin portion, the main portion including a first laminating section and an exposed section;
   defining at least one slit in the flexible substrate along at least one first imaginary boundary line between the exposed section and the peripheral margin portion;
   providing a rigid substrate, the rigid substrate comprising a main portion and a peripheral margin portion, the main portion including a second laminating section having a similar shape to the first laminating section and an unwanted section having a similar shape to the exposed section;
   laminating the flexible substrate to the rigid substrate to obtain a laminated substrate in such a matter that the first laminating section is attached to the second laminating section to form a first section, the exposed section is attached to the unwanted section to form a second section, and the peripheral margin portions are attached with each other to form a third section, wherein the at least one slit is defined in the flexible substrate prior to the step of laminating the flexible substrate to the rigid substrate;
   removing the unwanted section to expose the exposed section; and
   cutting the laminated substrate along an imaginary boundary line between the first section and the third section to remove the third section.

2. The method as claimed in claim 1, wherein the unwanted section is removed after the step of laminating the flexible substrate to the rigid substrate.

3. The method as claimed in claim 1, wherein the laminated substrate is cut after the step of removing the unwanted section.

4. The method as claimed in claim 1, wherein the at least one slit is formed in the flexible substrate using a laser beam.

5. The method as claimed in claim 1, wherein the laminated substrate is cut using a milling cutter.

6. The method as claimed in claim 1, wherein the at least one slit is formed in the flexible substrate using a blanking die.

7. The method as claimed in claim 2, wherein the laminated substrate is cut after the step of removing the unwanted section.

8. The method as claimed in claim 1, wherein in the step of laminating the flexible substrate to the rigid substrate, the first laminating section coincides with the second laminating section, and the exposed section coincides with the unwanted section.

* * * * *